(12) United States Patent
Pan et al.

(10) Patent No.: US 12,327,767 B2
(45) Date of Patent: Jun. 10, 2025

(54) OPTICAL INSPECTION APPARATUS IN SEMICONDUCTOR PROCESS SYSTEM

(71) Applicant: CHROMA ATE INC., Taoyuan (TW)

(72) Inventors: Shih-Yao Pan, Taoyuan (TW);
Hung-Tien Kao, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 782 days.

(21) Appl. No.: 17/562,238

(22) Filed: Dec. 27, 2021

(65) Prior Publication Data
US 2022/0208618 A1 Jun. 30, 2022

(30) Foreign Application Priority Data
Dec. 30, 2020 (TW) .................................. 109146974

(51) Int. Cl.
*H01L 21/66* (2006.01)
*H04N 23/695* (2023.01)

(52) U.S. Cl.
CPC ........... *H01L 22/12* (2013.01); *H04N 23/695* (2023.01)

(58) Field of Classification Search
CPC .. H01L 22/12; H01L 21/67288; H04N 23/695
See application file for complete search history.

(56) References Cited
U.S. PATENT DOCUMENTS
10,658,210 B2 * 5/2020 He ..................... H01L 21/67259
* cited by examiner

*Primary Examiner* — Dale E Page
*Assistant Examiner* — Quovaunda Jefferson
(74) *Attorney, Agent, or Firm* — WPAT, PC

(57) ABSTRACT

The present invention discloses an optical detection apparatus for defining a detection surface on a carrier unit for a wafer in a semiconductor manufacturing process so as to obtain a corresponding detection image, wherein a vertical movement path for another device to move is defined above the carrier unit. The optical detection apparatus includes a support, and an imaging device disposed on the support and configured to be non-interfering with the movement path. The imaging device includes a lens group, an image capturing portion and a moving base. With the moving base, the photosensitive element of the image capturing portion is allowed to move horizontally relative to the lens group, and the imaging position can be adjusted, preventing image deformation or a reduced resolution easily caused by capturing at an oblique angle. Thus, the optical detection apparatus resolves complications of additionally mounting an optical detection apparatus in an optical detection environment within a narrow space.

12 Claims, 2 Drawing Sheets

OPTICAL INSPECTION APPARATUS IN SEMICONDUCTOR PROCESS SYSTEM

BACKGROUND OF THE INVENTION

Field of the Invention

The present invention relates to an optical detection apparatus, and more particularly to an optical detection apparatus for defining a detection surface so as to obtain a corresponding detection image on a carrier unit of a wafer in a semiconductor manufacturing process.

Description of the Prior Art

In a semiconductor manufacturing process, a wafer needs to undergo various detections so as to ensure its quality. With the continual improvement of semiconductor manufacturing processing capabilities, requirements for wafers have become more stringent, and this results in demands of various detection apparatuses on production lines.

An optical detection apparatus is a common detection means. Detection apparatuses of different properties are provided to a surface of a wafer with numerous detection conditions so as to obtain detection images for read-end evaluation of the quality of the wafer. However, when a new optical detection apparatus is needed on an existing production line, it may be unfeasible to add the new optical detection apparatus frequently due to a limited space or without modifying various tools on the existing production line, causing manufacturing arrangement complications. Even if an additional optical detection apparatus is added, the imaging quality may be poor as a result of unsatisfactory imaging conditions because of the limited space, for example, image deformation or a low resolution, further leading to manufacturing arrangement complications.

SUMMARY OF THE INVENTION

It is an object of the present invention to provide an optical detection apparatus that can be readily mounted.

It is another object of the present invention to eliminate image deformation or a reduced resolution.

To achieve the above and other objects, the present invention provides an optical detection apparatus for defining a detection surface on a carrier unit of a wafer in a semiconductor manufacturing process so as to obtain a corresponding detection image, wherein a vertical movement path for another device to move is defined above the carrier unit. The optical detection apparatus includes a support, and an image device disposed on the support and configured to be non-interfering with the movement path. The imaging device includes a lens group, an image capturing portion and a moving base. An optical axis of the lens group is parallel to a normal line of the detection surface. The image capturing portion is disposed behind the lens group to allow an image of the detection surface to be formed on a photosensitive element in the image capturing portion. The moving base is disposed between the lens group and the image capturing portion and has an adjustment sliding track, wherein the adjustment sliding track allows the photosensitive element of the image capturing portion to move horizontally relative to the lens group.

In one embodiment of the present invention, a center axis of a photosensitive surface of the photosensitive element may deviate from the optical axis of the lens group by a predetermined distance in a direction away from the movement path.

In one embodiment of the present invention, the predetermined distance may be between $2/5$ and $2/3$ of a length of a diagonal line of the photosensitive element.

In one embodiment of the present invention, a vertical distance between the photosensitive surface of the photosensitive element and the detection surface may be not greater than 700 mm.

In one embodiment of the present invention, the photosensitive surface of the photosensitive element may be parallel to the detection surface, and the adjustment sliding track allows the photosensitive element of the image capturing portion to move in a direction parallel to the detection surface.

In one embodiment of the present invention, the imaging device may be configured above a side edge of the carrier unit.

In one embodiment of the present invention, the adjustment sliding track allows the photosensitive element to move in a direction of the diagonal line of the photosensitive element.

Accordingly, the optical detection apparatus disclosed is capable of avoiding other devices moving vertically above a wafer, and the special axial and horizontal motion design also prevents image deformation or a reduced resolution easily caused by capturing at an oblique angle, so that the optical detection apparatus resolves complications of additionally mounting an optical detection apparatus in an optical detection environment within a narrow space.

DETAILED DESCRIPTION OF THE EMBODIMENTS

The technical characteristics, contents, advantages and effects of the present invention will become apparent from the following detailed description taken with the accompanying drawing.

Terms, such as "a", "an" and "one", are descriptive of a unit, component, structure, device, module, system, region or zone to serve an illustrative purpose and define the scope of the present disclosure. Thus, unless otherwise specified, the terms must be interpreted to also mean "one or at least one", and their singular forms may also be plural forms.

Terms, such as "include", "comprise", "have" and the like, used herein are not restricted to essential elements disclosed herein; instead, the terms also apply to any other essential elements not definitely specified but inherently required for a unit, component, structure, device, module, system, region or zone.

Figure 1:
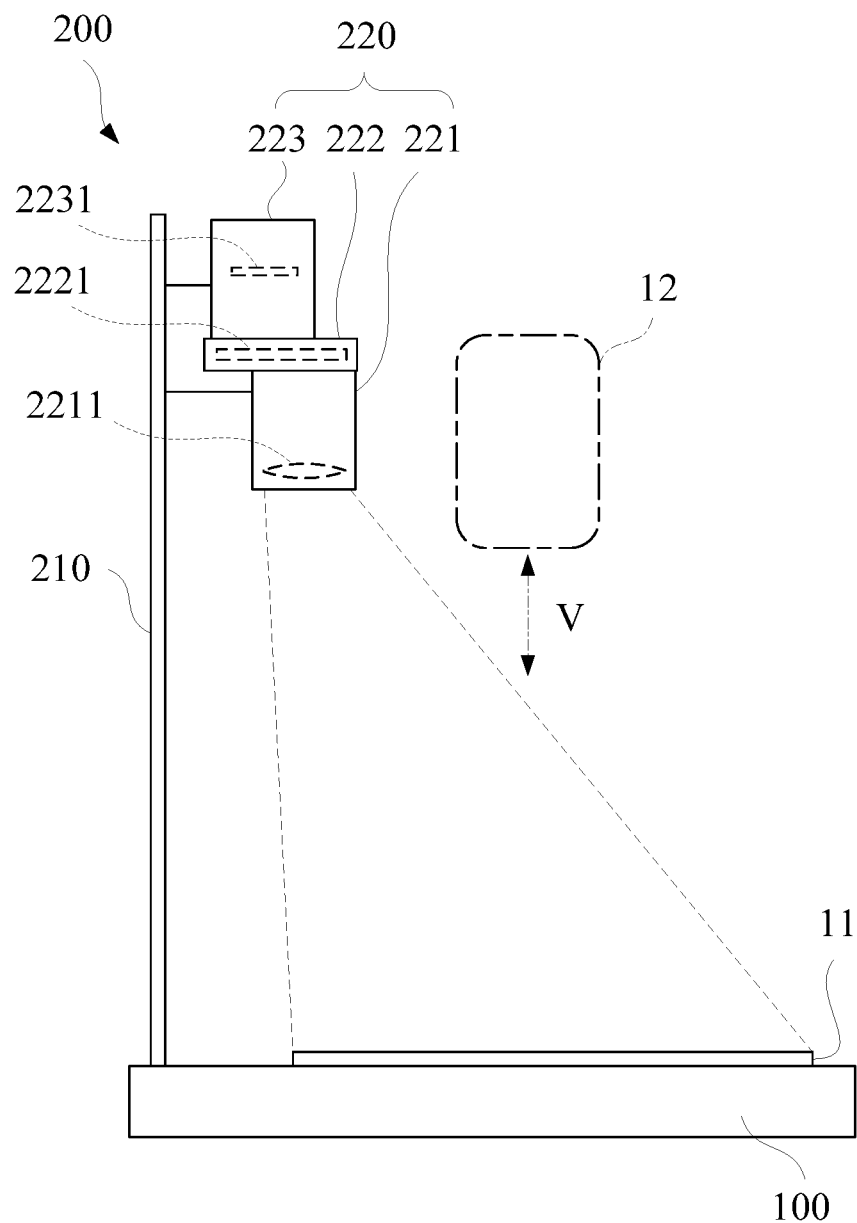
FIG. 1 is a schematic diagram of an optical detection apparatus according to an embodiment of the present invention and its application environment.
Figure 2:
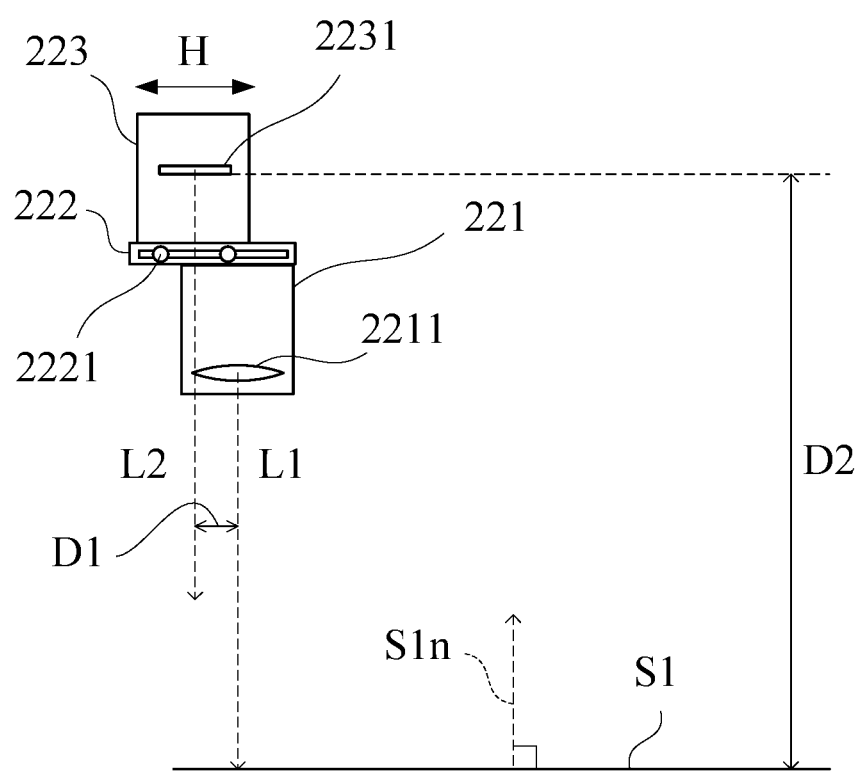
FIG. 2 is a schematic diagram of a configuration relation between an optical detection apparatus and a detection surface of the embodiment in FIG. 1.

Referring to FIG. 1 and FIG. 2, FIG. 1 shows a schematic diagram of an optical detection apparatus according to an embodiment of the present invention and its application environment, and FIG. 2 shows a schematic diagram of a configuration relation between an optical detection apparatus and a detection surface of the embodiment in FIG. 1.

As shown in FIG. 1, a carrier unit 100 carries a wafer 11 under test. The carrier unit 100 may be a moving transport platform on a production line, or may be a fixed carrier platform. Further, for example, the carrier unit 100 may be a combination of a chuck with a clamping or adsorption function and a carrier that carriers a wafer, or may be another device for securing the wafer 11.

FIG. 1 shows a station in a production line, wherein the station is provided with a device 12 above the carrier unit 100, and the device is, for example, another detection device. The device 12 has a movement path in a vertical direction V relative to the carrier unit 100, and such movement path results in that an optical detection apparatus cannot be further arranged above the carrier unit 100 to capture images in a forward imaging mode.

FIG. 1 and FIG. 2 show an optical detection apparatus 200 that is not necessarily arranged right above the carrier unit 100. The optical detection apparatus 200 includes a support 210 and an imaging device 220. The imaging device 220 is disposed on the support 210 and is configured above a side edge of the carrier unit 100, so as to be non-interfering with the device 12 having a movement path in the vertical direction V. The imaging device 220 may define a detection surface S1 on the carrier unit 100 carrying the wafer 11, and further obtains a corresponding detection image based on the detection surface S1. The detection surface S1 is, for example, any plane within a range having a depth of field (DOF) of a detection location with respect to the imaging device 220. In case of insufficient lighting conditions, an additional lighting device may also be used to establish an appropriate imaging environment.

When the carrier unit 100 is a fixed carrier platform, the support 210 may be assembled with the carrier unit 100, as shown in FIG. 2. In other implementation forms, the support 210 may be assembled on another peripheral position.

The imaging device 220 includes a lens group 221, an image capturing portion 223 and a moving base 222. The lens group 221 guides (or collects) light from the wafer 11 for the rear-end image capturing portion 223 to obtain a corresponding detection image. The moving base 222 is disposed between the lens group 221 and the image capturing portion 223, and has an adjustment sliding track 2221. The adjusting sliding track 2221 allows a photosensitive element 2231 in the image capturing portion 223 to move in a horizontal direction H relative to the lens group 221.

The adjustment sliding track 2221 is, for example, horizontal movement assemblies disposed on two opposite side edges on a top portion of the lens group 221, allowing light to be transmitted from a middle portion of the moving base 222 onto the photosensitive element 2231 of the image capturing portion 223. The adjustment sliding track 221 is operable for a center axis L2 of a photosensitive surface of the photosensitive element 2231 to move horizontally in a direction away from the movement path in the vertical direction V, further deviating from an optical axis L1 of the lens group 221. The optical axis L1 of the lens group 221 is parallel to a normal line S1n of the detection surface S1.

In sum, the photosensitive surface of the photosensitive element 2231 is preferably configured to be parallel to the detection surface S1, and the adjustment sliding track 2221 allows the photosensitive element 2231 of the image capturing portion 223 to move in a direction parallel to the detection surface S1. The imaging device 220 of the optical detection apparatus 200 is not mounted in a manner of capturing images in an oblique angle that easily causes image deformation and a reduced resolution of a distal image, but is arranged such that an imaging position can be adjusted by horizontal movements.

The lens group 221 is provided with a lens 2211 therein, and the lens 2211 shown in FIG. 1 and FIG. 2 merely represents an example. The lens 2211 in fact may include multiple lenses and form a lens group, with the optical axis L1 formed as well. With the lens 2211, an imaging circle may be formed in the image capturing portion 223, and further by moving the photosensitive element 2231 with a certain extent by the moving base 222, a range within the imaging circuit may be corresponded with the light from the wafer 11, so as to form oblique imaging as shown in FIG. 1. Moreover, the photosensitive surface of the photosensitive element 2231 is parallel to the detection surface S1, and the optical axis L1 of the lens group 221 is parallel to the normal line S1n of the detection surface S1. Thus, the issues of image deformation and a reduced resolution caused by an imaging mode in which the optical axis L1 is non-parallel to the normal line S1n of the detection surface S1 are eliminated from the optical detection apparatus 200.

With the configuration of the moving base 222, the photosensitive element 2231 can be moved and adjusted horizontally to match the detection surface S1 within a certain range on the carrier unit 100. The larger imaging circle provided by the lens group 221 also offers the photosensitive element 2231 with a greater range of horizontal movements for matching the detection surface S1 of a greater range. In terms of the horizontal matching, preferably, the adjustment sliding track 2221 is configured such that the horizontal movement of the photosensitive element 2231 is in an extension direction (axial direction) of a diagonal line of the photosensitive element 2231.

As shown in FIG. 2, the center axis L2 of the photosensitive surface of the photosensitive element 2231 is in a direction away from the movement path in the vertical direction V, and preferably deviates from the optical axis L1 of the lens group 221 by a predetermined distance D1. The predetermined distance D1 is between $2/5$ and $2/5$ of the length of the diagonal line of the photosensitive element 2231. For example, under the foregoing condition, a vertical distance D2 between the photosensitive surface of the photosensitive element 2231 and the detection surface S1 does not need to be more than 700 mm. Thus, for the wafer 11 in a 12-inch standard, by using 8 to 10 cm in an outward direction from the edge of the wafer 11 above as a configuration space for the optical detection apparatus 200, the object of mounting an additional optical detection apparatus within a narrow space can be achieved, while the obtained image still has good image quality.

In conclusion, with the moving base, the photosensitive element of the image capturing portion is allowed to move horizontally relative to the lens group, and the imaging position can be adjusted. Such special axial horizontal motion design prevents image deformation or a reduced resolution easily caused by capturing at an oblique angle, so that the optical detection apparatus resolves complications of additionally mounting an optical detection apparatus in an optical detection environment within a narrow space.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent changes and replacements made to the aforesaid embodiments shall fall within the scope of the present disclosure. Accordingly, the legal protection for the present disclosure shall be defined by the appended claims.

What is claimed is:

1. An optical detection apparatus in a semiconductor manufacturing process, for defining a detection surface on a carrier unit for a wafer so as to obtain a corresponding detection image, a movement path in a vertical direction for another device to move being defined above the carrier unit, the optical detection apparatus comprising:
   a support; and
   an imaging device, disposed on the support and configured to be non-interfering with the movement path, the imaging device comprising:
      a lens group, having an optical axis parallel to a normal line of the detection surface;
      an image capturing portion, disposed behind the lens group to allow an image of the detection surface to be formed on a photosensitive element in the image capturing portion; and
      a moving base, disposed between the lens group and the image capturing portion, the moving base having an adjustment sliding track, the adjustment sliding track allowing the photosensitive element of the image capturing portion to move in a horizontal direction relative to the lens group.

2. The optical detection apparatus of claim 1, wherein the photosensitive element includes a diagonal line, and the adjustment sliding track allows the photosensitive element to move horizontally relative to the lens group and along a direction in which the diagonal line extends.

3. The optical detection apparatus of claim 1, wherein a center axis of the photosensitive surface of the photosensitive element deviates from the optical axis of the lens group by a predetermined distance in a direction away from the movement path.

4. The optical detection apparatus of claim 3, wherein the photosensitive element includes a diagonal line, and the adjustment sliding track allows the photosensitive element to move horizontally relative to the lens group and along a direction in which the diagonal line extends.

5. The optical detection apparatus of claim 3, wherein the predetermined distance is between $2/5$ and $2/5$ of a length of a diagonal line of the photosensitive element.

6. The optical detection apparatus of claim 5, wherein the photosensitive element includes a diagonal line, and the adjustment sliding track allows the photosensitive element to move horizontally relative to the lens group and along a direction in which the diagonal line extends.

7. The optical detection apparatus of claim 5, wherein a vertical distance between the photosensitive surface of the photosensitive element and the detection surface is not more than 700 mm.

8. The optical detection apparatus of claim 7, wherein the photosensitive element includes a diagonal line, and the adjustment sliding track allows the photosensitive element to move horizontally relative to the lens group and along a direction in which the diagonal line extends.

9. The optical detection apparatus of claim 1, wherein the photosensitive surface of the photosensitive element is parallel to the detection surface, and the adjustment sliding track allows the photosensitive element of the image capturing portion to move horizontally in a direction parallel to the detection surface.

10. The optical detection apparatus of claim 9, wherein the photosensitive element includes a diagonal line, and the adjustment sliding track allows the photosensitive element to move horizontally relative to the lens group and along a direction in which the diagonal line extends.

11. The optical detection apparatus of claim 1, wherein the imaging device is configured above a side edge of the carrier unit.

12. The optical detection apparatus of claim 11, wherein the photosensitive element includes a diagonal line, and the adjustment sliding track allows the photosensitive element to move horizontally relative to the lens group and along a direction in which the diagonal line extends.

\* \* \* \* \*